United States Patent
Ibrahim et al.

(10) Patent No.: US 10,422,721 B2
(45) Date of Patent: Sep. 24, 2019

(54) MEASUREMENT SYSTEM AND METHOD TO INTERROGATE BIREFRINGENT OPTICAL SENSORS WITH A FREQUENCY SWEPT SOURCE BASED INTERROGATOR

(71) Applicant: FAZ TECHNOLOGY LTD., Dublin (IE)

(72) Inventors: Selwan K. Ibrahim, Dublin (IE); John O'Dowd, Dublin (IE); Devrez Mehmet Karabacak, Dublin (IE)

(73) Assignee: FAZ TECHNOLOGY LTD., Dublin (IE)

( * ) Notice: Subject to any disclaimer, the term of this patent is extended or adjusted under 35 U.S.C. 154(b) by 0 days.

(21) Appl. No.: 15/560,105

(22) PCT Filed: Mar. 21, 2016

(86) PCT No.: PCT/EP2016/056181
§ 371 (c)(1),
(2) Date: Sep. 20, 2017

(87) PCT Pub. No.: WO2016/150927
PCT Pub. Date: Sep. 29, 2016

(65) Prior Publication Data
US 2018/0088002 A1    Mar. 29, 2018

Related U.S. Application Data
(60) Provisional application No. 62/135,843, filed on Mar. 20, 2015.

(30) Foreign Application Priority Data
Mar. 20, 2015    (EP) .................................... 15160185

(51) Int. Cl.
G01M 11/00    (2006.01)
G01D 5/353    (2006.01)
(Continued)

(52) U.S. Cl.
CPC ..... G01M 11/3181 (2013.01); G01D 5/35316 (2013.01); G01D 5/35387 (2013.01);
(Continued)

(58) Field of Classification Search
CPC ... G01M 11/3181; G01J 4/00; G01D 5/35316
(Continued)

(56) References Cited

U.S. PATENT DOCUMENTS

| 7,973,914 B2 * | 7/2011 | Omichi | ................. | G01B 11/18 250/225 |
| 2010/0134783 A1 * | 6/2010 | Omichi | ................. | G01B 11/18 356/33 |

FOREIGN PATENT DOCUMENTS

| EP | 1192500 B1 | 4/2002 |
| WO | WO2014096292 A1 | 6/2014 |

OTHER PUBLICATIONS

PCT/EP2016/056181. International Search Report & Written Opinion (dated Aug. 22, 2016).

* cited by examiner

*Primary Examiner* — Roy M Punnoose
(74) *Attorney, Agent, or Firm* — Loza & Loza, LLP; Anthony G. Smyth

(57) ABSTRACT

The invention provides a measurement system to interrogate at least one birefringent optical sensor and a method to interrogate birefringent optical sensors at high speed and high resolution. The system and method detects, at least, a first and a second spectral feature that are polarization dependent, wherein the detected first and second spectral features correspond to different responses of at least one birefringent optical sensor.

22 Claims, 10 Drawing Sheets

(51) Int. Cl.
*H01S 5/068* (2006.01)
*H01S 5/0687* (2006.01)
(52) U.S. Cl.
CPC ........ *H01S 5/0687* (2013.01); *H01S 5/06804* (2013.01); *H01S 5/06821* (2013.01)
(58) Field of Classification Search
USPC ........................................................ 356/364
See application file for complete search history.

MEASUREMENT SYSTEM AND METHOD TO INTERROGATE BIREFRINGENT OPTICAL SENSORS WITH A FREQUENCY SWEPT SOURCE BASED INTERROGATOR

FIELD

The invention relates to a measurement system and method to interrogate birefringent optical sensors for measuring and/or monitoring one or more physical variables.

BACKGROUND

Optical sensors such as standard Fibre Bragg Gratings (FBG) are known from prior art. Generally such sensors are interrogated with polarized frequency swept sources (e.g. polarized tunable lasers) and suffer from polarization dependent frequency shift (PDFS) problems, typically in the range of 1-4 pm depending on the technique used to write the FBG and the birefringence induced when packaged in a transducer.

A type of FBGs, called birefringent FBGs, (Bi-FBG), are known from prior art. Such Bi-FBG are known to have polarization dependent responses to an interrogation signal. Examples of Bi-FBGs, such as polarization maintaining FBGs (PM-FBG), are disclosed in published papers by G. Chen, et al. "Simultaneous strain and temperature measurements with fibre Bragg grating written in novel hi-bi optical fibre", *IEEE Photonics Technology Letters* 2004, 16(1), p 221-223] and micro-structured FBGs (MS-FBG)] and S. Sulejmani, et al. "Control over the pressure sensitivity of Bragg grating-based sensors in highly birefringent microstructured optical fibres", *IEEE Photonics Technology Letters*, 2012, 24(6), p 527-529].

Bi-FBGs that provide a response to at least two different physical variables are known from prior art, for example, PM-FBG (temperature and strain) or MS-FBG (temperature and pressure).

PM-FBG sensors can provide strain-independent temperature measurements and/or self-compensating strain measurements without a requirement for an extra temperature FBG, while MS-FBG sensors can provide temperature-independent pressure measurements without a requirement for an extra FBG. Since Bi-FBGs inherently have a high PDFS, any polarization changes will dominantly affect the amplitude of the FBG peaks rather than their position.

EP Patent publication number EP 1192500, assigned to Optoplan, discloses a method for measurements of the orthogonally polarized minimum and maximum Bragg wavelengths of one or several birefringent fibre Bragg grating FBG sensors. However a problem with gathering such information from Bi-FBGs is that high precision monitoring and interrogating of their polarization-dependent wavelengths in order to provide sensing applications with an acceptable accuracy at a high acquisition speed is required.

It is therefore an object of the invention to provide a measurement system and method to interrogate and monitor birefringent optical sensors.

It is a further object of the invention to reduce the complexity of the system while maintaining high speed and resolution measurements.

SUMMARY

According to the invention there is provided, as set out in the appended claims, a measurement system for interrogating at least one birefringent optical sensor, said system comprising a tunable laser source and a polarization control device, wherein the system is configured with one or more modules to:

sweep the tunable laser at a predetermined frequency range at least once to interrogate the birefringent optical sensor; and detect, at least, a first and a second spectral feature that are polarization dependent.

In one embodiment the first and second spectral features correspond to a first and a second wavelength response of the at least one birefringent optical sensor and provide a measurement function of at least one of temperature, strain or pressure.

In one embodiment the first and second spectral feature comprises a first and a second wavelength peak.

In one embodiment the system is configured to calculate the wavelength distance between the first and second detected peaks and determine at least one of temperature, strain or pressure measurement from the calculated wavelength distance.

In one embodiment the first and/or second spectral feature comprises at least one of: an absolute wavelength of individual sensor reflection, a relative spacing between two reflection peak positions and/or their amplitudes.

In one embodiment the polarization control device comprises a passive polarization birefringent fibre adapted to scramble a polarization state of the tunable laser.

In one embodiment an output of the polarization control device is connected to a Mach-Zehnder Interferometer (MZI) device, wherein measurement peaks from the MZI device are synchronous with polarization change in the system such that two Bi-FBG responses corresponding to two orthogonal polarizations are generated. It will be appreciated that this embodiment is based on the passive PM-MZI that is used for generating synchronous frequency and polarization information so that the two orthogonal responses can be detected within one sweep after compensating the delay in the system and selecting the correct sample or samples.

In one embodiment the spectral features from the Bi-FBG responses correspond to a first and second detected peak and the difference between the peaks is measured to provide a measurement function such as at least one of temperature, strain or pressure.

In one embodiment the MZI and polarization control device comprises a polarization maintaining fibre configured with a desired polarization launch angle and length and adapted to provide frequency and polarization information used to interrogate said at least one birefringent optical sensor.

In one embodiment the polarization control device comprises an active polarization switch.

In one embodiment the active polarization switch is configured to change the polarization state for different wavelength sweeps of the tunable laser.

In one embodiment at least one polarization dependent wavelength feature is detected in one or more wavelength sweeps.

In one embodiment the active polarization control device is configured to operate as a synchronous polarization switch and adapted to control the state of polarization in a synchronous fashion to interrogate the at least one birefringent sensor by measuring the orthogonal responses between different wavelength sweeps. A full polarization maintaining PM path can be provided between the sensor and interrogator and aligned so that one sensor response is detected on each orthogonal state of the polarization switch. This will guarantee the detection of only one of the orthogonal responses on every (even) scan and the other on every (odd) scan. This means that over two scans both orthogonal peaks are guaranteed to be detected and the delta wavelength can be reported or calculated.

In one embodiment the orthogonal spectral responses measured over multiple sweeps are averaged initially and processed to find the first and a second spectral feature and provide a measurement function of at least one of temperature, strain or pressure from said spectral features. This is based on the fact that by scanning at least two sweeps and averaging the spectrum of the two sweeps guarantees that two peaks will be present and then peak processing can be performed.

In one embodiment the orthogonal spectral responses measured over multiple sweeps processed initially and then averaged to find the first and a second spectral feature and provide a measurement function such as at least one of temperature, strain or pressure from said spectral features.

In one embodiment the polarization control device comprises an asynchronous polarization scrambler.

In one embodiment the response of the birefringent sensor is filtered within a single sweep to detect two orthogonal responses and the measurement can be averaged over multiple sweeps corresponding to different static polarization rotations per sweep. In one embodiment a variable linear phase retarder using a LiNbO3 phase modulator with a 45° input polarization alignment angle is provided and connected to a linearly polarized tunable laser source via a polarization maintaining fibre can deliver high speed asynchronous scrambling. However this technique doesn't cover all polarization states. A synchronous polarization switch >n states connected in series with the variable linear phase retarder can be provided so that more polarization states can be covered.

In one embodiment there is provided a plurality of birefringent optical sensors arranged in series along a single optical fibre.

In one embodiment there is provided a plurality of birefringent optical sensors connected to the interrogator using standard single mode fibre or polarization maintaining fibre.

In one embodiment the amplitude of the responses are measured and used to evaluate the polarization state and rate of change on the fibre.

In one embodiment the tunable laser can dynamically sweep around the spectral feature regions and ignore regions where there is no sensor information to achieve higher sweep rates.

In another embodiment there is provided a system comprising an interrogator and a birefringent fibre sensor, wherein the interrogator is arranged for sweeping a predetermined frequency range at a first polarization state; and the interrogator is arranged for sweeping the predetermined frequency range at a second polarization state.

In one embodiment there is provided a measurement system configured with one or more modules to:
sweep the tunable laser at a predetermined frequency range at least once to interrogate the birefringent optical sensor; and
detect, at least, a first and a second spectral feature that are polarization dependent, wherein the detected first and second spectral features correspond to different responses of the at least one birefringent optical sensor.

In one embodiment there is provided a method of interrogating at least one birefringent optical sensor the method comprising the steps of:

sweeping the tunable laser at a predetermined frequency range at least once to interrogate the birefringent optical sensor; and
detecting a first and a second spectral feature that are polarization dependent, wherein the detected first and second spectral features correspond to different responses of the at least one birefringent optical sensor.

In another embodiment there is provided a method for interrogating at least one birefringent optical sensor using an interrogator system comprising a tunable laser source and a polarized control device, the method comprising the steps of:
sweeping the tunable laser at a predetermined frequency range at least once to interrogate the birefringent optical sensor; and
detecting a first and a second spectral feature that are polarization dependent.

The invention provides a system and method to interrogate birefringent optical sensors with a polarized frequency swept optical interrogator by using means of controlling the output polarization and detecting both orthogonal responses from the sensor with high precision at high speed in a feed-forward configuration.

In one embodiment the MZI and polarization control device comprises a polarization maintaining fibre configured with a desired polarization launch angle and length adapted to provide frequency and polarization information used to interrogate said at least one birefringent optical sensor.

In one embodiment the active polarization switch is configured to change the polarization state for different wavelength sweeps of the tunable laser. One of the main advantages of this embodiment is the ability to sweep rapidly and accurately with one polarization then switch orthogonal polarization, repeat sweep and average spectras. As such, it eliminates the need to use polarization maintaining fibre or high speed active scrambler.

In one embodiment the response of the birefringent sensor is filtered within a single sweep to detect two orthogonal responses and the measurement can be averaged over multiple sweeps corresponding to different static polarization rotations per sweep.

In another embodiment there is provided a system comprising an interrogator and a birefringent fibre sensor, wherein the interrogator is arranged for sweeping a predetermined frequency range at a first polarization state; and the interrogator is arranged for sweeping the predetermined frequency range at a second polarization state.

In another embodiment there is provided a method of interrogating at least one birefringent optical sensor using an interrogator system comprising a tunable laser source and a polarized control device, the method comprising the steps of:
sweeping the tunable laser at a predetermined frequency range at least once to interrogate the birefringent optical sensor;
detecting a first and second wavelength peak that are polarization dependent; and
calculating the wavelength distance between the first and second detected peaks.

In one embodiment the MZI and scrambler comprises polarization maintaining fibre configured with a desired polarization launch angle and length adapted to provide frequency and polarization information and measure birefringence induced wavelength shifts in interrogated sensors.

In one embodiment there is provided a system for interrogating at least one birefringent optical sensor, said system comprising an interrogator and a birefringent fibre sensor, wherein the interrogator is arranged for sweeping a predetermined frequency range at a first polarization state; and the interrogator is arranged for sweeping the predetermined frequency range at a second polarization state.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

The invention provides a polarization interrogation and monitoring system used in a tunable laser based optical interrogator, measuring sensor characteristics obtained from one or more optical birefringent FBG sensors.

Figure 1:
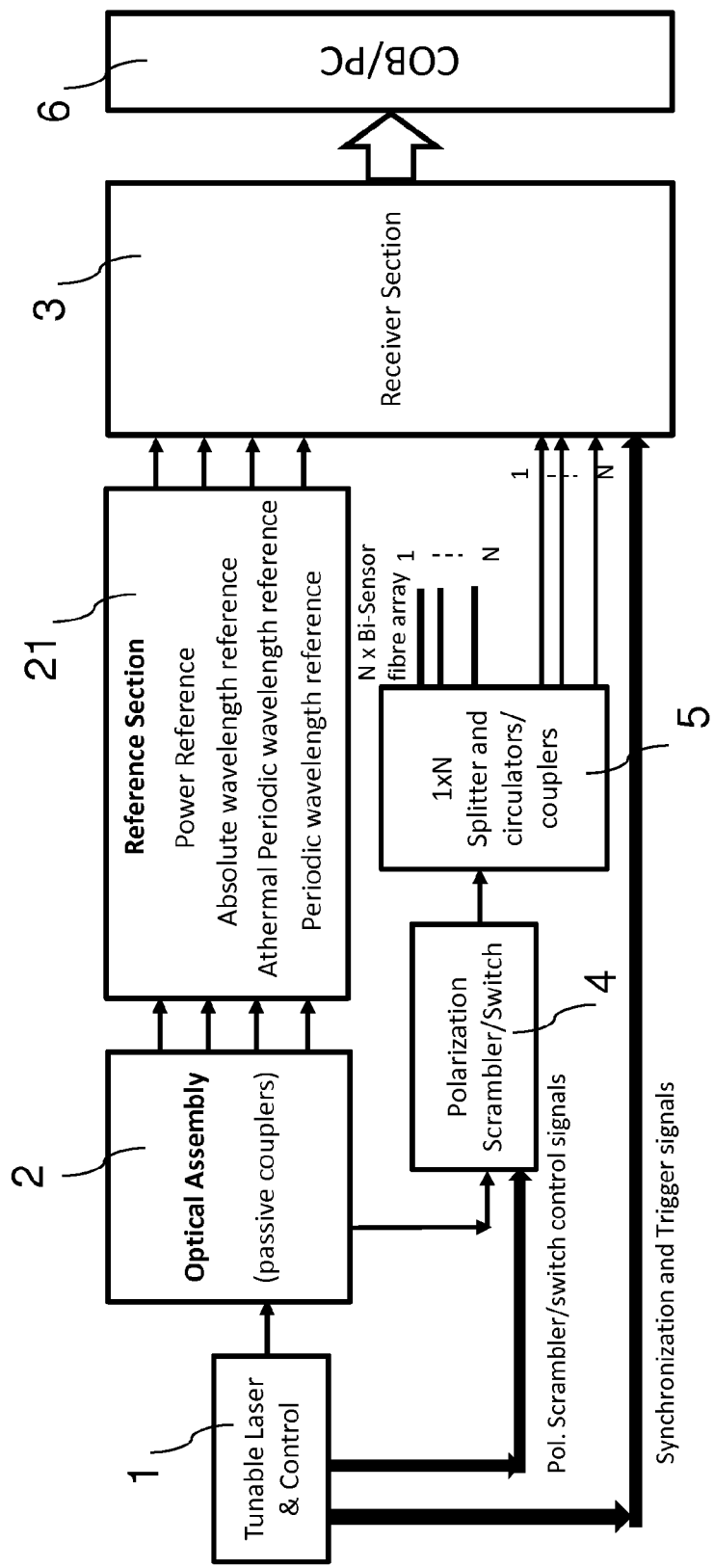
FIG. 1 shows a general block diagram of the main sections and interconnection between them for an N fibre channel tunable laser based optical interrogator.

An interrogator system design is shown in FIG. 1. The interrogator comprises five main sections: a tunable laser source and associated control unit, 1; an optical assembly, 2; a receiver section 3; a polarization/scrambling section 4; an optical splitter section 5; and a processing unit 6. In a particular embodiment, the optical assembly 2, comprises a number of passive optical components (for example splitters, couplers and/or circulators) and an optical reference system that provides a plurality of references 21 to a receiver section 3. In one embodiment the references 21 may comprise an absolute wavelength reference (Gas cell), one or more periodic wavelength references (Etalon/Mach-Zehnder interferometer MZI, and a power reference. The receiver section, 3, can include photo-receivers, analog to digital converters (ADCs) and a FPGA. Furthermore, the processing unit, 6, can be a computer on board unit (COB) or any other processing unit device.

In use, a laser source is controlled by means of the control unit 1 in order to perform a frequency sweep, i.e., emitting light at a determined number of frequencies within a range. Part of the light is split in the optical assembly 2 to feed the described references 21. The other part is fed to the polarization scrambler/switch section 4 before been split again to provide an interrogation laser sweep signal for different optical channels connected to different fibres containing a single or multiple optical birefringent sensors.

The polarization scrambling/switch shown in section 4 provides a means of interrogating a Bi-FBG sensor by controlling the laser output polarization state in synchronous or asynchronous fashion. The Bi-FBG response can be reported back as two magnitude peaks at determined frequencies wherein there is a relationship between the detected peak frequencies and the physical variables that are to be measured by the Bi-FBG, this relationship will be further discussed with respect to FIGS. 9 and 10.

Figure 2:
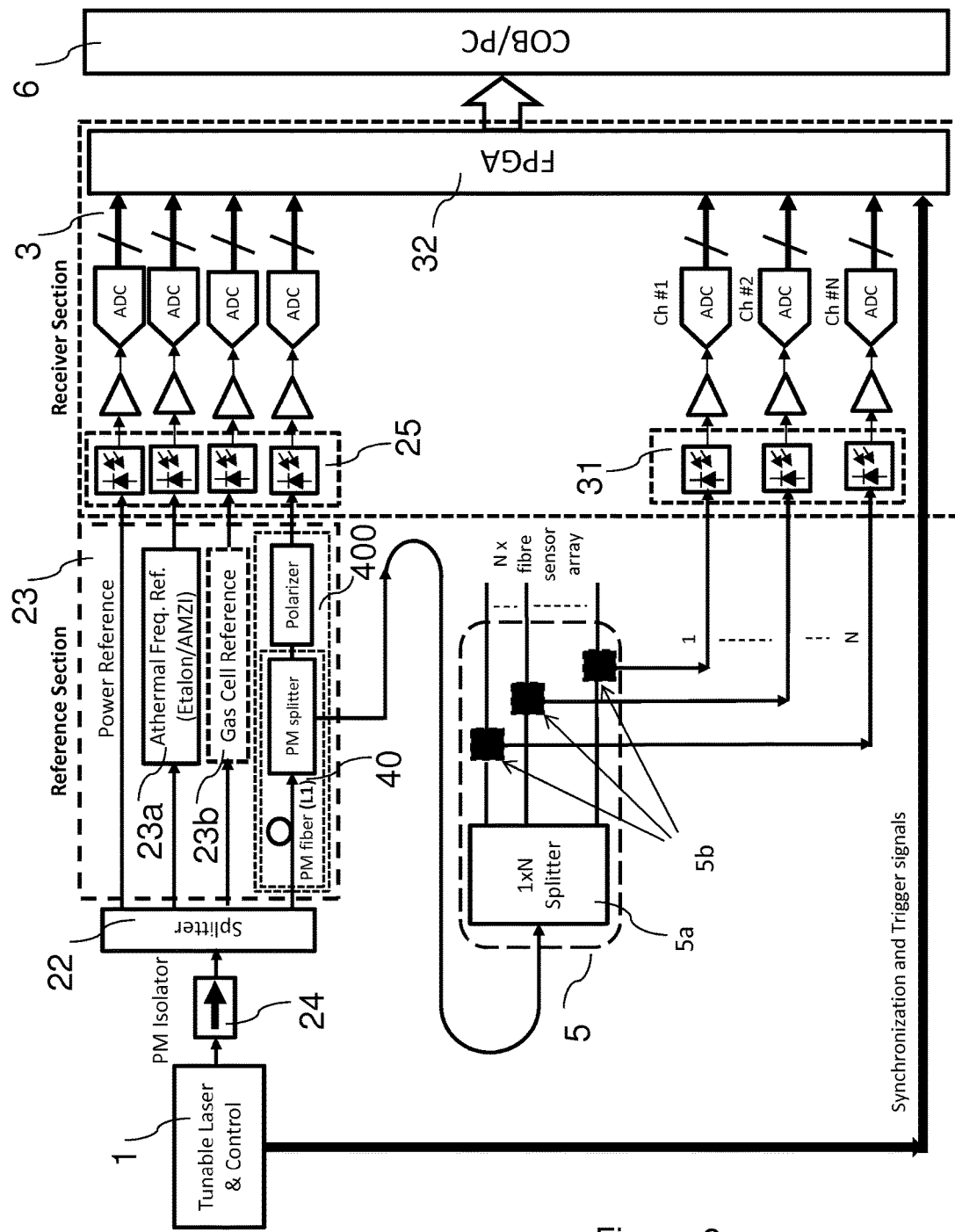
FIG. 2 shows a schematic diagram of an N fibre channel tunable laser based optical interrogator with a PM fibre based MZI and passive polarization scrambler.

The interrogator unit in FIG. 2 shows an exemplary embodiment of the system shown in FIG. 1. The tunable laser transmitters and control unit 1 is connected to a splitter section 22 that provides a tap of the laser output to the reference section 23 consisting of different optical components (for example a Gas Cell 23b, Etalon, Mach-Zehnder Interferometer (MZI) 23a, or other suitable components). An isolator 24 is connected to the laser output to minimize reflections back to the laser 1. This could be either internal or external to the tunable laser and control unit 1. The optical fibres exiting the reference section 23 are guided to one or more photodiodes to detect the reference signals required for the interrogator operation. In this schematic, a PM MZI and PM passive scrambler 40, that accomplishes a similar function as the polarization scrambler/switch section 4 in FIG. 1, share the same fibre where one output connected via a PM coupler to a polarizer is used for the MZI and the other output is used as the PM passive scrambler.

Figure 3:
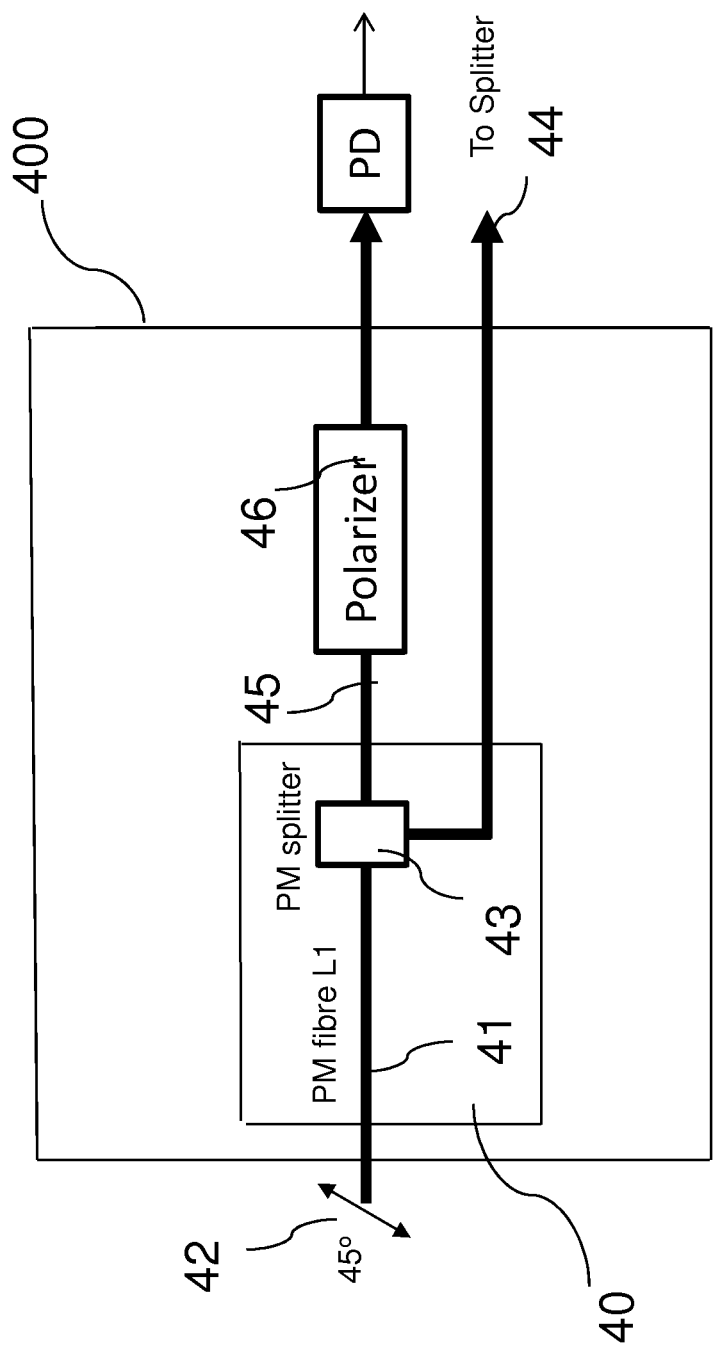
FIG. 3 shows an exemplary embodiment of passive polarization scrambler.

FIG. 3 illustrates one embodiment of an arrangement of PM MZI and PM passive scrambler 40 that may be used in the embodiment of FIG. 2. In particular, this figure shows a passive polarization maintaining (PM) birefringent fibre 41 used as a continuous waveplate to scramble the polarization state of the laser emitted by the source. The passive scrambler may be constructed using a piece of PM fibre where the input 42 is spliced with the polarized laser output with a 45 degree angle between the birefringence axes and the other end is connected to a PM coupler/splitter 43 with one output 44 connected to the splitter section 5 for the Bi-FBG sensors. It will be appreciated that the laser output can be split at other angles to 45 degrees depending on operation. The other output 45 of the PM coupler/splitter is followed by a polarizer 46 to construct the MZI. Since the interrogator of the present embodiment requires an MZI for operation, this arrangement 40 may be useful given that, if a passive scrambler is to be used, a single PM fibre 41 is shared between the MZI and scrambler as shown in FIG. 3.

Referring again to FIG. 2 the output of the arrangement 40 shown at the PM splitter tap is guided to the optical splitter section 5 which includes a 1×N optical splitter 5a and N number of 3 dB couplers/circulators 5b which are then connected to N optical fibre channels that include the optical birefringent sensors. The signals reflected back from the sensors are then passed to the receiver section 3. The receiver section 3 includes the banks of photodiodes 31 and receiver circuits which are connected to a high speed data processing unit such as, e.g., a processing FPGA (Field Programmable Gate Array) 32. The high speed data is processed to reduce the data set and extract the raw/filtered peak wavelengths and other spectral information of the birefringent sensors. This processed data is passed from memory to a processor, for example a computing device 6, and can be post-processed depending on the application or measurement required. For applications where rapid environmental changes on the fibre and the sensor are observed, a requirement for high speed polarization switching/scrambling and high speed laser sweeping is required in order to capture all of the external effects induced on the sensor.

Figure 4:
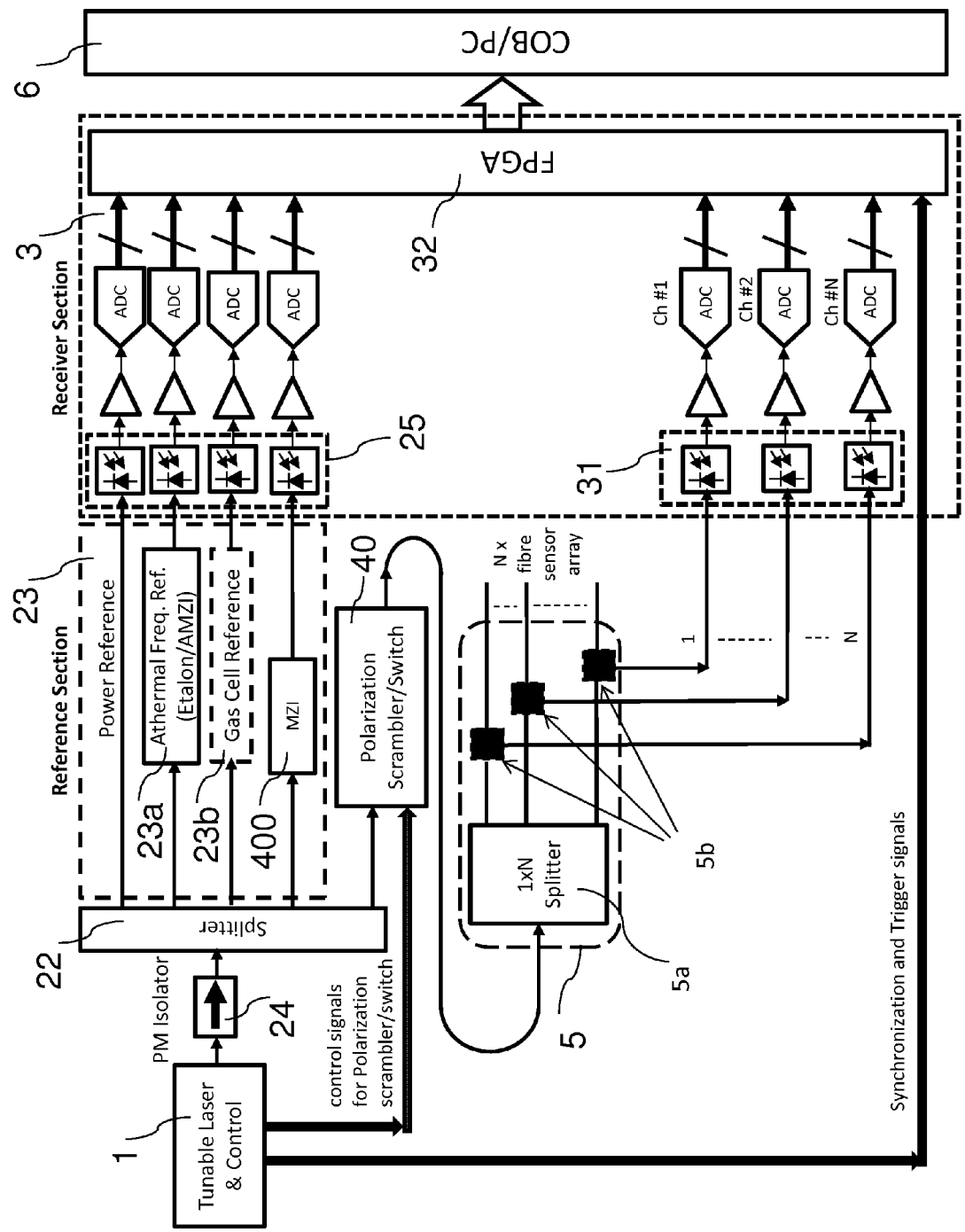
FIG. 4 shows an embodiment of an active polarization scrambler (Synchronous/Asynchronous)

FIG. 4 shows a schematic diagram of an alternative configuration for the interrogator wherein an active polarization switch/scrambler 400 is used instead of a passive one as compared to FIG. 2. In this schematic a MZI can be implemented using any technology (e.g. fibre based using PM fibre, optical couplers, photonic integrated circuit, free space optics) and/or replaced by an integrated ring resonator based MZI.

Figure 5:
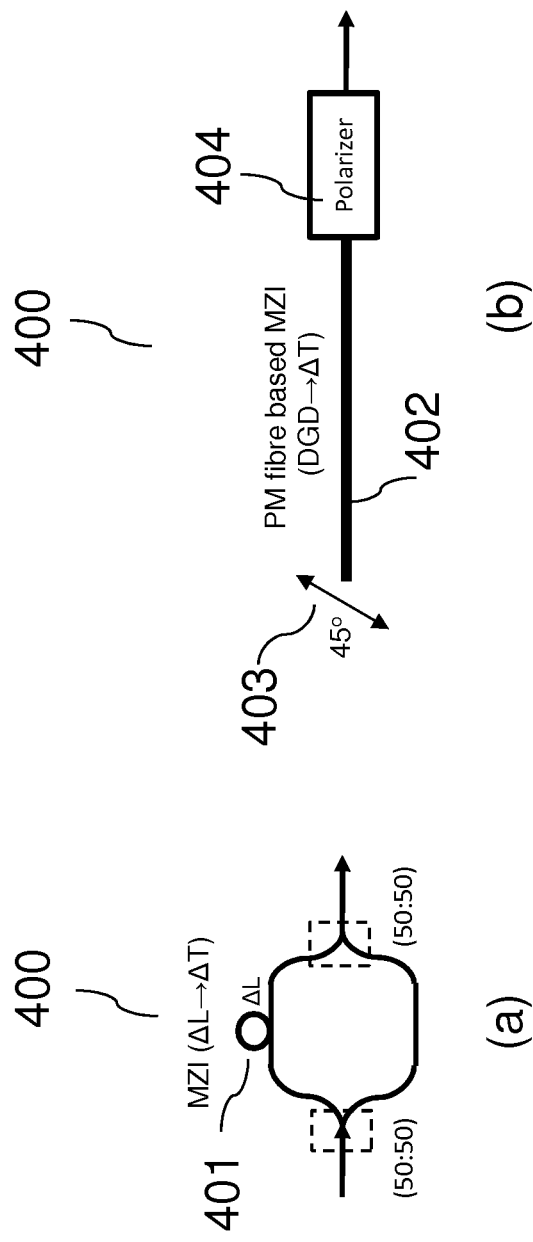
FIG. 5 shows a schematic diagram of the construction of the MZI using PM components (couplers/fibres)

Two different MZI implementations are shown in FIG. 5, (a) using PM couplers 401 spliced together with a certain path length difference to form an interferometer, and FIG. 5(*b*) using a piece of PM fibre 402 with a certain length (differential group delay) to construct an interferometer when the input 403 is spliced with a 45 degree angle and the output is connected to a polarizer 404. It will be appreciated that the laser output can be split at other angles to 45 degrees depending on operation.

Figure 6:
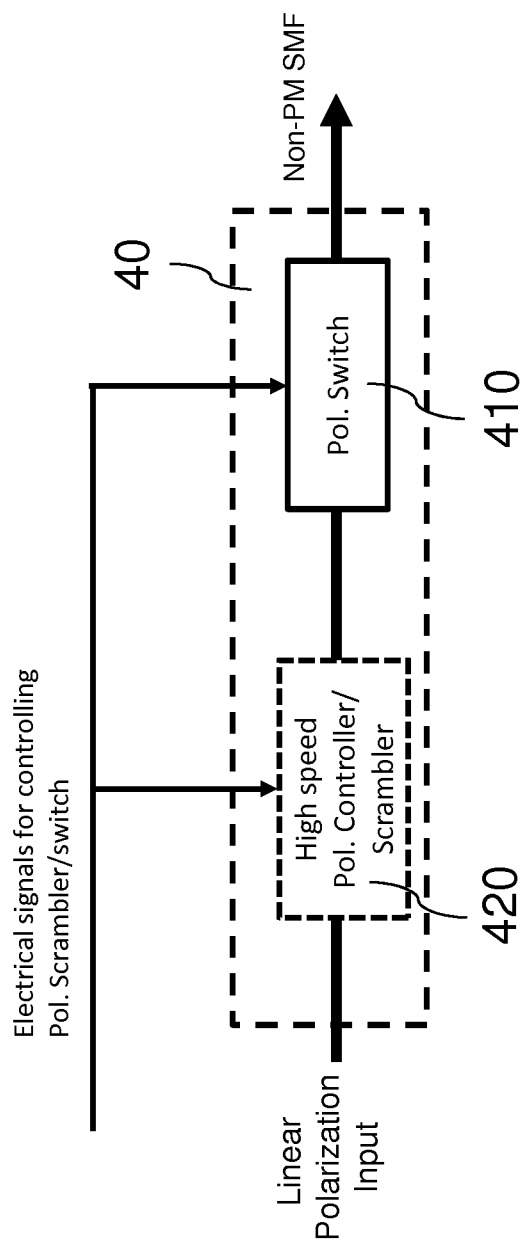
FIG. 6 shows a schematic diagram of the construction of the active depolarizer.

Referring again to FIG. 4 a tap of the laser output exiting splitter section 22 is fed to the active polarization scrambler/switch section 400 which is shown in more detail in FIG. 6. In one embodiment the active polarization scrambler/switch section 400 is a high speed polarization switch 410 (with N states, where N>=2) operating in synchronous operation with the laser sweep trigger, or/and a high speed polarization scrambler 420 (asynchronous) which operates at a rate higher than the receiver photodiodes BW and can be constructed using single or multiple wave plates using different technologies (e.g. LiNbO3 based devices driven by high speed sine wave signals). The output of the polarization scrambler 400 is then guided to the optical splitter section 5 which includes a 1×N optical splitter and N number of 3 dB couplers/circulators which are then connected to N optical fibre channels that include the optical birefringent sensors. The signals reflected back from the sensors are then passed to the receiver section 3. The receiver section includes the banks of photodiodes 31 and receiver circuits which are connected to a high speed data processing unit such as, e.g., a processing FPGA (Field Programmable Gate Array) 32. The high speed data is processed to reduce the data set and extract the raw/filtered peak wavelengths and other spectral information of the birefringent sensors, similar to FIG. 2 described above.

The tunable laser and control unit 1 may consist of a C-band laser covering 1528-1568 nm and potentially more lasers covering different bands, such as using an L-Band laser covering ~1568-1608 nm, giving an 80 nm total coverage. It is also possible to use a single tunable laser/swept source that covers multiple bands. Using additional laser(s) can increase reliability and increase the number of interrogated sensors. Instead of using an L-band laser to double the number of sensors, an additional C-Band laser can be used instead combined with doubling the number of optical fibres to ensure parallel operation of both laser devices. Each laser output is split into N fibres, where each fibre contains multiple optical birefringent optical sensors. The number of birefringent optical sensors on a single fibre will depend on the wavelength spacing between the different sensors and the dynamic range of each to avoid any wavelength overlap. A tap of the tunable/swept laser signal is also used to feed a referencing subsystem which provides the baseline high accuracy and resolution of the measurement.

It will be appreciated that in order to provide the coarse measurement, a stable distinct wavelength response (e.g. peaks, troughs or slopes) can be detected to provide at least one stable wavelength marker. When combined with a fine periodic wavelength reference (e.g. MZI) which provides multiple wavelength markers, the start and stop of a sweep can be defined and the sweep can be linearized.

The control block also generates the trigger signals for the active polarization controlling device (switch/scrambler).

With regards to the system shown in FIGS. 1 to 6 the invention provides a system and method of interrogating at least one birefringent optical sensor using an interrogator system comprising a tunable laser source and a polarized control device, by sweeping the tunable laser at a predetermined frequency range at least once to interrogate the birefringent optical sensor; detecting a first and second wavelength peak that are polarization dependent. Spectral information from the peaks can be analysed to measure various characteristics or physical variables.

The polarization-dependent characteristics of the Bi-FBG sensor or sensors that is obtained can be analysed via various data analysis schemes (e.g. curve fitting with different equations) to identify at least two spectral characteristics or features (e.g. absolute wavelengths of the individual peak reflections, the relative spacing between two reflection peak positions and/or their amplitudes) that are responsive to at least two parameters (like pressure, temperature, strain, etc.). Polarization dependent characteristics of the Bi-FBG that can be processed in accordance with the invention are described in more detail below with respect to FIGS. 7 to 10. Nonetheless, in a particular embodiment, several spectral features can be analysed for each polarization state.

To measure the at least two polarization dependent spectral features (e.g. orthogonal peaks/troughs) with a polarized swept source interrogator, an extra polarization controller/scrambler, such as 40 of FIG. 2 or 400 of FIG. 4, is required to either scramble the polarization or track the polarization at high speed. The speed of the polarization controller will depend on the laser tuning rate, sweep rate, and interrogator receiver bandwidth. For tuning rates >0.1 pm/ns and receiver BW>20 MHz, the polarization scrambler speed needs to be in the order of hundreds of MHz which means high speed, high cost, multi-waveplate polarization controllers would be required.

In addition to that in order to resolve the wavelength spacing between the two polarization dependent spectral features, high accuracy and high resolution measurements are required. It will be appreciated to the skilled person in the art that the two peaks/responses from the Birefringent sensors can be orthogonal (e.g. orthogonal peaks for Bi-FBGs).

The multiple spectral characteristics that are extracted from one or more Bi-FBGs can then be analysed simultaneously to rapidly identify and quantify the multiple physical effects with great precision. In one application, the relative wavelengths from Bi-FBGs can be resolved with an accuracy 1-100 fm allowing for strain independent temperature to be monitored within 0.001 to 0.1 degree Celsius resolution and temperature independent pressure to be monitored to within 0.001 to 0.1 bar resolution.

As the reflective wavelengths of the Bi-FBG in both absolute and relative spectral positions can be adjusted during manufacture, in one preferred configuration multiple Bi-FBGs are positioned on individual fibres with multiple fibres being monitored to allow for many sensing locations to be recorded simultaneously.

Example Operation

In operation, a laser performs a wavelength sweep at a fixed scan rate (e.g. several kHz for the full wavelength band) and a fixed tuning rate (e.g. 0.1 pm/ns). The laser output is polarized and can be maintained using a polarization maintaining (PM) fibre.

Figure 7:
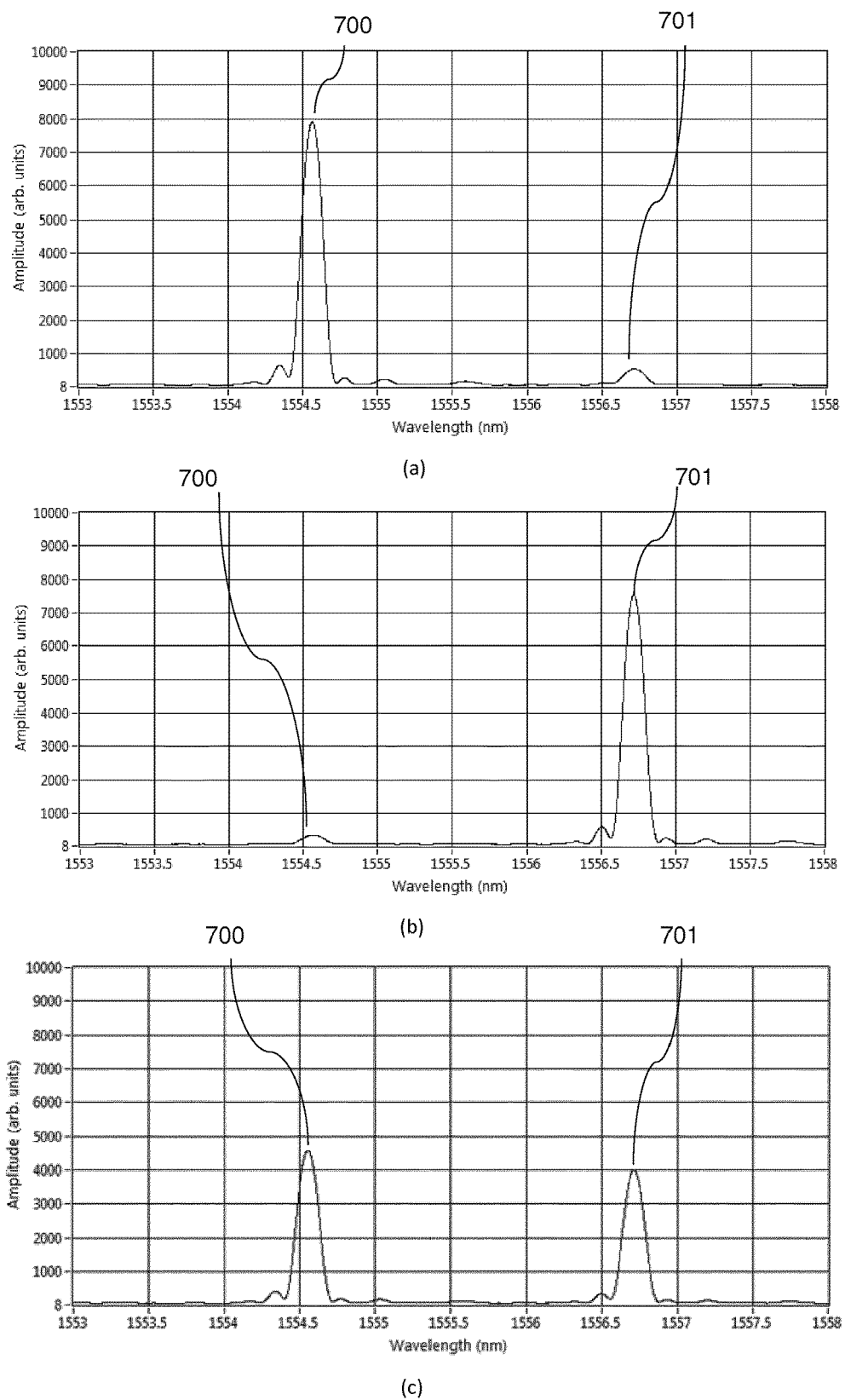
FIG. 7 illustrates typical reflected Bi-FBG responses corresponding to different incident state of polarization on the sensor a) left orthogonal peak, b) Right orthogonal peak, c) both orthogonal peaks.

For birefringent FBGs (e.g. PM-FBG and/or MS-FBG), the FBG sensors exhibit birefringence and two different FBG responses, for example two orthogonal FBG peaks, are generated and separated by a certain wavelength spacing (e.g. 0.5-2 nm). The reflected response will depend on the incident state of polarization. Since the polarization state in the fibre can wander, the incident state of polarization on the sensor can change with time due to temperature and/or any physical change (e.g. bends and on the fibre). FIG. 7 illustrates a reflected response of the sensor to show either the first FBG response 700 along with a number of smaller responses, the second FBG response 701 with a number of smaller responses, or both responses 700 and 701 with similar or different amplitudes as shown in FIGS. 7 (*a*), (*b*), and (*c*) respectively.

It is to be noted that FIG. 7(*a*) shows a response of the Bi-FBG to a first polarization state, in this response a first peak (700) has a smaller amplitude that the second peak (701). For FIG. 7(*b*) the amplitude of the second peak (701) is smaller than the amplitude of the first peak (701). Therefore a sum of the signals of FIGS. 7(*a*) and 7(*b*), as shown in FIG. 7(*c*), can be established in order to determine possible changes in the responses for the first peak (700) and the second peak (701) wherein the first peak (700) is related to a first physical parameter to which the Bi-FBG is subjected and the second peak (701) is related to a second physical parameter to which the Bi-FBG is subjected. In most cases, the first peak (700) and the second peak (701) are both responsive to the first and second physical parameters but with different sensitivities therefore allowing their measurement. It will be appreciated that different peaks can end up with similar amplitudes or different amplitudes and in some cases one peak will have zero amplitude while the other peak has a max amplitude.

To interrogate the different responses of the Bi-FBG with a standard tunable laser interrogator, the invention provides an efficient means of controlling the polarization and processing the responses. It is possible to achieve this by using at least one or more passive or active polarization control devices.

Referring again to FIGS. 2 and 3, a passive polarization maintaining birefringent fibre is used as a continuous waveplate to scramble the polarization state of the laser emitted by the source.

Figure 8:
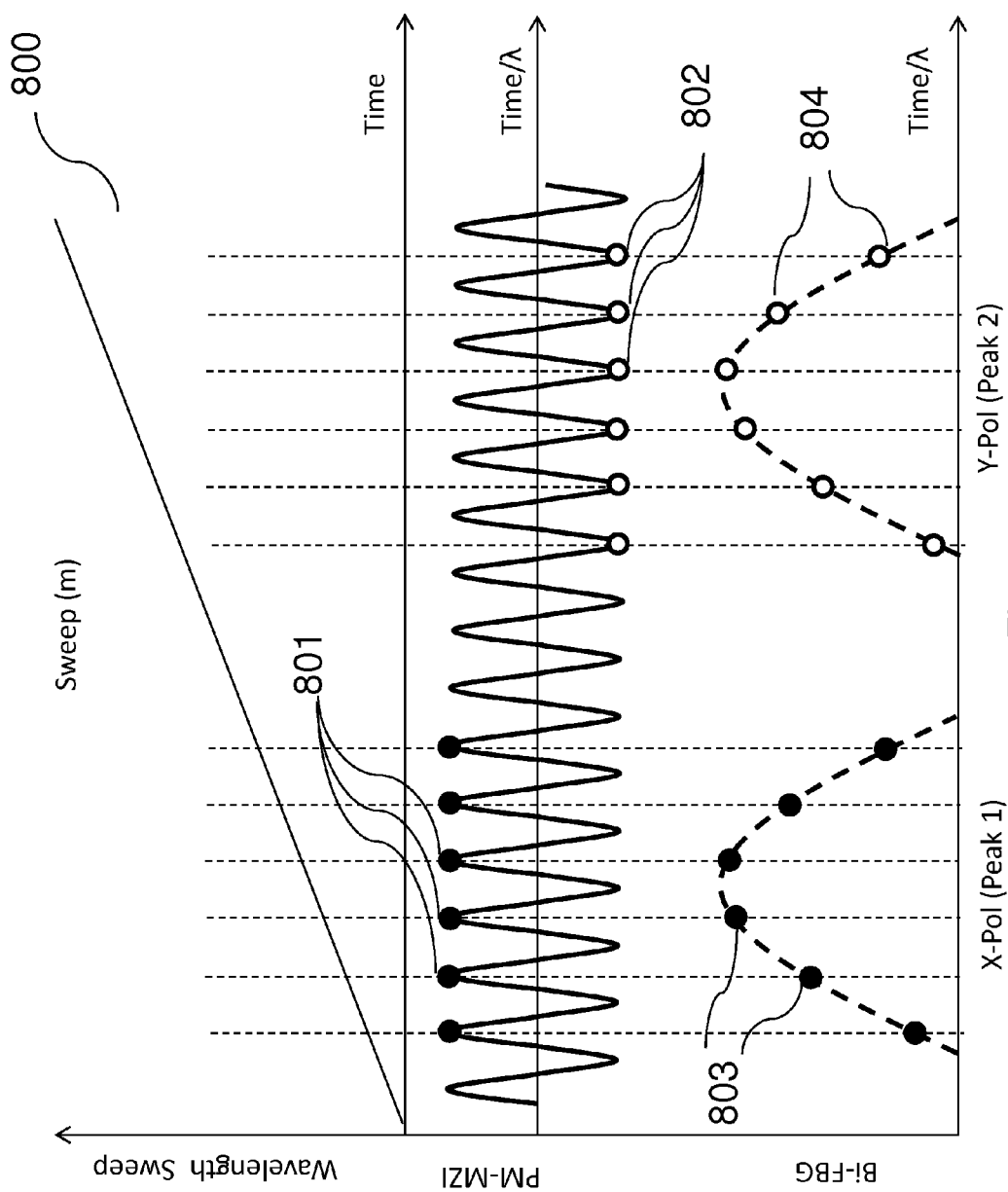
FIG. 8 illustrates how the peaks and troughs of the PM-MZI signal can be used to estimate the birefringence by detecting the two orthogonal FBG responses on a single sweep.

In one embodiment, since the same PM fibre is used for both the MZI and passive polarization scrambler 40, the samples measured from the MZI are synchronous with the polarization change. As shown in FIG. 8, for one wavelength sweep 800 of the laser, peaks 801 on the MZI signal will correspond to a certain polarization state, while the troughs 802 correspond to an orthogonal polarization state. This information can be used to construct the first FBG response 803 and the second FBG response 804 corresponding to two orthogonal polarizations. The peaks measured from the first and second FBG responses 803, 804 can be averaged and filtered to generate two unique orthogonal FBG responses as shown in FIG. 8.

The above approach allows the polarization and wavelength to be sampled at the same time, and having both effects sampled accordingly in lock step with each other. When the wavelength is swept the rotation of the polarization becomes wavelength dependent and the polarization state at the output of the passive scrambler rotates in proportion to the wavelength and the length of the PM fibre. The polarization state of the laser output will change in synchronous with the detected MZI crossings, peaks, and troughs, which correlates to the birefringent optical sensor response enabling the detection of the two orthogonal polarization states 803 and 804.

With the wavelength axis calibrated and the round trip distance of the Bi-FBG compensated, spectral information from the Bi-FBG wavelength peaks are detected and tracked. Based on the Bi-FBG sensor calibration data, the wavelength shift and difference between the peaks can be translated into actual measurements (e.g. Temperature/Strain/Pressure). The processing is performed at the receiver section 3 and can be, for example, implemented in the FPGA 32 and/or within a computer on board (COB) 6. Several peak detection algorithms (e.g. Gaussian, Polynomial, Sine, Bisected skirt) can be deployed and optimized based on the application.

Figure 9:
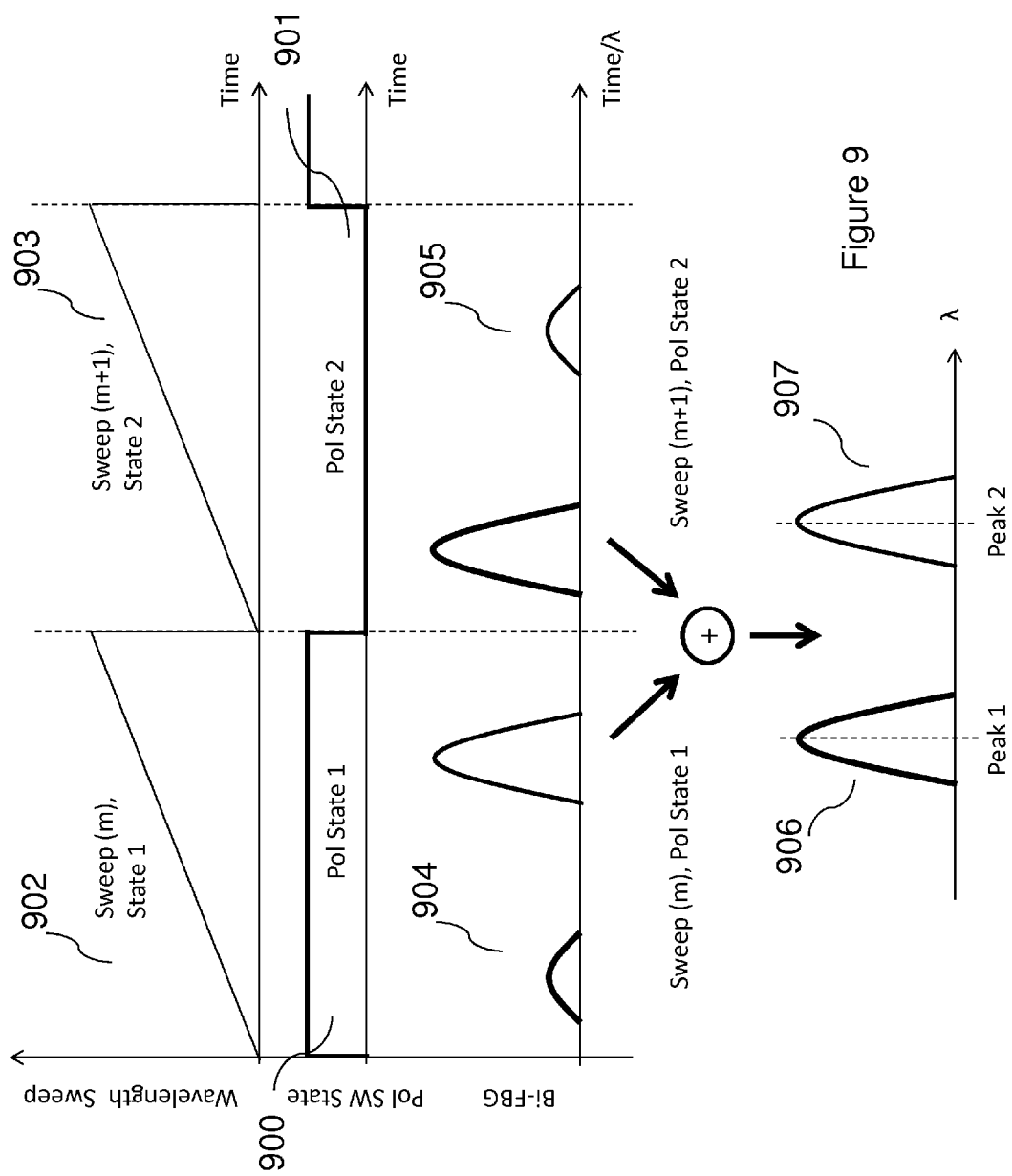
FIG. 9 illustrates a typical reflected Bi-FBG response (2 orthogonal FBG responses for a single sensor) measured over two consecutive sweeps with two orthogonal polarizations showing the FBG response (peak 1) on the first scan detected with the polarization switch on state 1, and the second FBG response (peak 2) measured at the second sweep with the polarization switch on state 2.

Referring again to FIG. 4, an active polarization switch/controller 400 is used in this embodiment. This active polarization switch/controller 400 can be constructed by using either an N-state polarization switch (synchronous to the laser sweep), a high speed polarization scrambler (asynchronous to the laser sweep), or a combination of both as shown in FIG. 6. Making reference to such embodiment, an analysis of the results expected to be obtained is now analysed in view of FIG. 9. An example of the polarization switch is a 2-state orthogonal switch which flips between two orthogonal polarization states 900 and 901 every n number of sweeps, where two sweeps 902 and 903 are shown in FIG. 9. When the polarization state applied to the sensor changes between two orthogonal states, the different responses of the Bi-FBG to the orthogonal interrogation signals will be observed as 904 and 905 depending on the incident state of polarization on the Bi-FBG sensor. Since this rate of change occurs at a rate higher than the signal bandwidth of interest, the response can be summed and/or averaged, therefore allowing the detection of two Bi-FBG responses corresponding to the two orthogonal responses of the Bi-FBG are shown as 906 and 907 in FIG. 9. The spectral information obtained corresponding to the two orthogonal responses can be processed as described above with respect to FIGS. 2 and 8. It will be appreciated that where PM fiber is present no summing or averaging of the spectral features is required.

It is also possible to apply a peak detection scheme on the reflected response on every sweep and then average the peak results. Based on the amplitude of the reflected peaks which are dependent on the incident polarization state as shown in FIG. 7, either select one peak per scan (FIGS. 7 (*a*) and (*b*)) or select two peaks per scan (FIG. 7 (*c*)) before averaging the peaks by a minimum scan number of two.

This will guarantee reporting of two peak locations every two or more scans.

It is also possible to use more than 2 polarization states (N-state polarization switch) and increase the number of averaged scans (spectrum or peaks). The increase in the number of polarization states used in the scans can result in a higher accuracy in capturing the polarization dependent responses of the birefringent fibre sensors connected. In one embodiment, 6-state sweep can be performed to collect responses from 0, +45, 90, −45, left circular and right circular polarizations to obtain a large range of responses.

Figure 10:
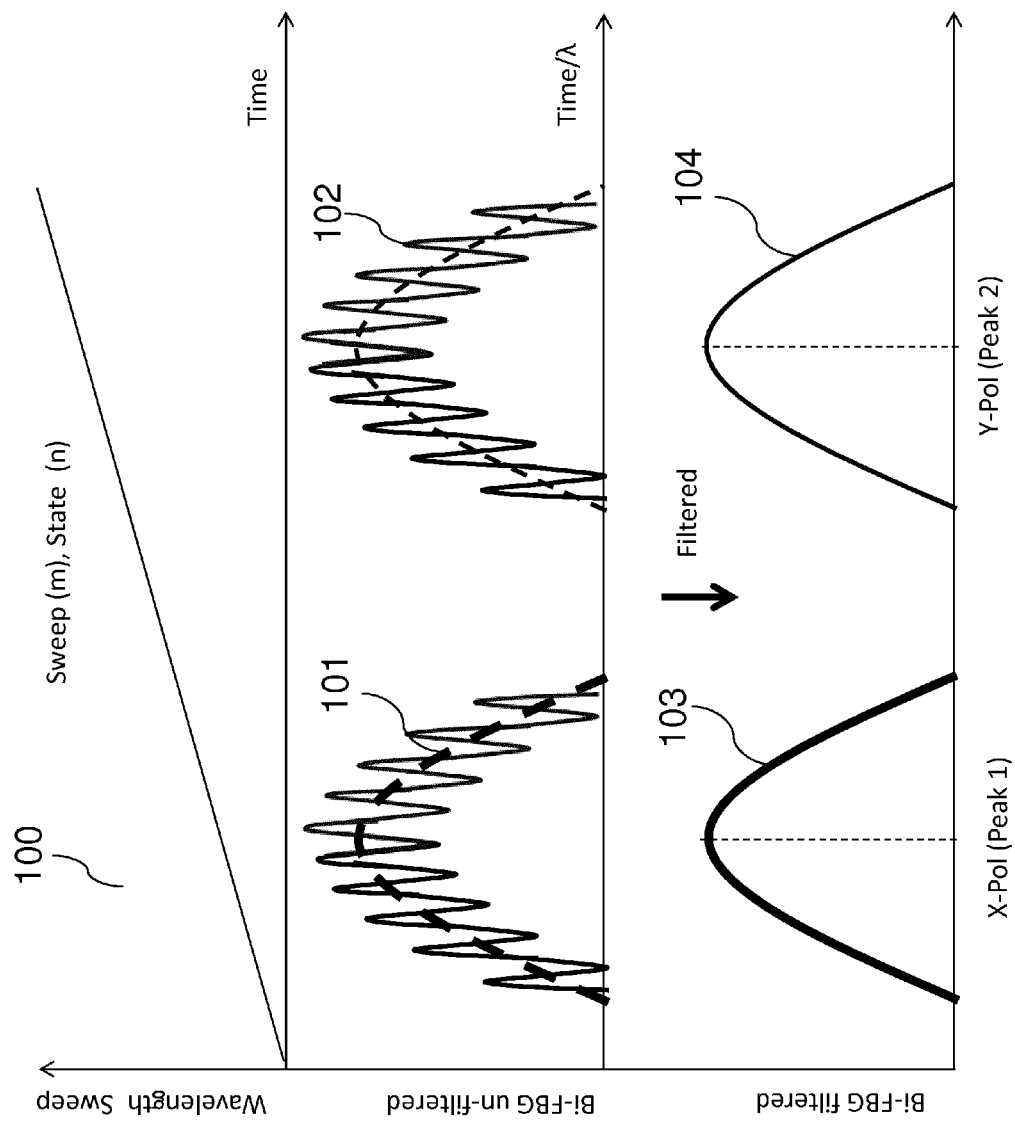
FIG. 10 illustrates a typical reflected Bi-FBG response (2 orthogonal FBG responses for a single sensor (2 peaks)) measured over one sweep with the polarization switch set at on a static polarization state (m) and the polarization scrambler (single or multiple waveplates driven by a sine wave) used to scramble the polarization at high speed which can be filtered out using the receiver analogue bandwidth (BW) or in DSP.

In another embodiment of the invention for environments with high frequency vibrations/polarization changes on the fibre, an asynchronous high speed polarization scrambler can be used with or without the polarization switch. The high speed polarization scrambler can be based on a high speed LiNbO3 polarization scrambler or a LiNbO3 phase modulator with a 45 degree input polarization angle alignment. The device can be driven with an electrical signal with a frequency higher than the receiver BW. FIG. 10 shows the response of the Bi-FBG when the polarization SW is on a static polarization state (n) at a given sweep (m) indicated by the reference numeral 100. Since the scrambler will be running at a higher rate (e.g. >200 MHz) a ripple will be observed on both FBG responses 101 and 102 within a single sweep. When filtering/averaging the response (in analogue or digital domain), for example by using a low pass filter with a cut-off frequency <20 Mz, the ripple will be removed and the two orthogonal FBG responses 103 and 104 will be observed as shown in FIG. 10. The spectral information obtained corresponding to the two orthogonal responses can be processed as described above with respect to FIGS. 2 and 8.

The embodiments in the invention described with reference to the drawings comprise a computer apparatus and/or processes performed in a computer apparatus in combination with a tunable laser source and a polarization control device. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation.

The invention is not limited to the embodiments hereinbefore described but may be varied in both construction and detail.

The invention claimed is:

1. A measurement system to interrogate responses of at least one birefringent optical sensor, said system comprising a tunable laser source and a polarization control device, wherein the system is configured to:

sweep the tunable laser at a predetermined frequency range at least once to interrogate the birefringent optical sensor; and detect a first and a second spectral feature that are polarization dependent, wherein each of the detected first and second spectral features corresponds to a response of the at least one birefringent optical sensor; and analyze the first and the second spectral features to measure multiple characteristics, wherein the first and second spectral features comprise a first and a second wavelength peak or trough respectively.

2. The system of claim 1 wherein the first and second spectral features are summed or averaged for a polarization state and the spectral information obtained correspond to the respective responses of the at least one birefringent optical sensor.

3. The system of claim 1 wherein the first spectral feature at a first polarization state is detected during a first sweep of the tunable laser and the second spectral feature at a second polarization state is detected during a second sweep of the tunable laser.

4. The system of claim 1 wherein the first and second spectral features correspond to a first and a second wavelength response of the at least one birefringent optical sensor and provide a measurement function of at least one of temperature, strain or pressure.

5. The system of claim 1 wherein the system is configured to calculate the wavelength distance between the first and second detected peaks and determine at least one of temperature, strain or pressure measurement from the calculated wavelength distance.

6. The system of claim 1 wherein the first or second spectral feature comprises at least one of: an absolute wavelength of individual sensor reflection, a relative spacing between two reflection peak positions or their amplitudes.

7. The system of claim 1 wherein the polarization control device comprises a passive polarization birefringent fiber adapted to change the polarization state of the tunable laser during a sweep.

8. The system of claim 1 wherein an output of the polarization control device is connected to a Mach-Zehnder Interferometer (MZI) device, wherein measurement peaks from the MZI device are synchronous with polarization change in the system such that two Bi-FBG responses corresponding to two orthogonal polarizations are generated.

9. The system of claim 1 wherein the polarization control device comprises an active polarization switch.

10. The system of claim 9 wherein the active polarization switch is configured to change the polarization state for different wavelength sweeps of the tunable laser.

11. The system of claim 9 wherein at least one polarization dependent wavelength feature is detected in one or more wavelength sweeps.

12. The system as claimed in claim 9 wherein the polarization control device is configured to operate as a synchronous polarization switch and adapted to control state of polarization in a synchronous fashion to interrogate the at least one birefringent sensor by measuring orthogonal responses between different wavelength sweeps.

13. The system of claim 12 wherein the response of the birefringent sensor is filtered within a single sweep to detect two orthogonal responses and the measurement can be averaged over multiple sweeps corresponding to different static polarization rotations per sweep.

14. The system as claimed in claim 9, wherein the polarization control device is configured to operate as a synchronous polarization switch and adapted to control state of polarization in a synchronous fashion to interrogate the at least one birefringent sensor by measuring orthogonal responses between different wavelength sweeps, and wherein orthogonal spectral responses measured over multiple sweeps are detected initially and then averaged to find the first and second spectral feature and provide a measurement function such as at least one of temperature, strain or pressure from said spectral features.

15. The system as claimed in claim 1, wherein the polarization control device comprises an asynchronous polarization scrambler constructed using a single wave plate.

16. The system of claim 1 comprising a plurality of birefringent optical sensors arranged in series along a single optical fiber.

17. The system of claim 1 comprising a plurality of birefringent optical sensors connected to and interrogator using standard single mode fiber or polarization maintaining fiber.

18. The system of claim 1, wherein amplitudes of the responses are measured and used to evaluate polarization state and rate of change on a fiber.

19. The system of claim 1, wherein the tunable laser can dynamically sweep around spectral feature regions and ignore regions where there is no sensor information to achieve higher sweep rates.

20. The system of claim 1 wherein the system comprises a reference section optically coupled to the tunable laser source.

21. A method of interrogating at least one birefringent optical sensor using an interrogator system comprising a tunable laser source and a polarized control device, the method comprising the steps of:

sweeping the tunable laser at a predetermined frequency range at least once to interrogate the birefringent optical sensor; and detecting a first and a second spectral feature that are polarization dependent, wherein each of the detected first and second spectral features corresponds to a response of the at least one birefringent optical sensor; and analyzing the first and the second spectral features to measure multiple characteristics, wherein the first and second spectral features comprise a first and a second wavelength peak or trough respectively.

22. The method of claim 21 wherein the interrogator system comprises a reference section optically coupled to the tunable laser source.

* * * * *